(12) United States Patent
Mannebach et al.

(10) Patent No.: US 11,367,684 B2
(45) Date of Patent: Jun. 21, 2022

(54) RECESSED METAL INTERCONNECTS TO MITIGATE EPE-RELATED VIA SHORTING

(71) Applicant: Intel Corporation, Santa Clara, CA (US)

(72) Inventors: Ehren Mannebach, Beaverton, OR (US); Kevin Lin, Beaverton, OR (US); Richard Vreeland, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 883 days.

(21) Appl. No.: 15/985,561

(22) Filed: May 21, 2018

(65) Prior Publication Data
US 2019/0355665 A1 Nov. 21, 2019

(51) Int. Cl.
*H01L 23/532* (2006.01)
*H01L 23/528* (2006.01)
*H01L 21/768* (2006.01)
*H01L 21/8234* (2006.01)
*H01L 23/522* (2006.01)
*H01L 21/321* (2006.01)

(52) U.S. Cl.
CPC ...... *H01L 23/5329* (2013.01); *H01L 21/7684* (2013.01); *H01L 21/76834* (2013.01); *H01L 21/76837* (2013.01); *H01L 21/76877* (2013.01); *H01L 21/823475* (2013.01); *H01L 23/528* (2013.01); *H01L 23/5226* (2013.01); *H01L 21/3212* (2013.01)

(58) Field of Classification Search
CPC ... H01L 23/52; H01L 23/522; H01L 23/5221; H01L 23/5226; H01L 23/528; H01L 21/823425; H01I 27/76801; H01I 21/76837
See application file for complete search history.

(56) References Cited

U.S. PATENT DOCUMENTS

| 6,650,017 | B1 * | 11/2003 | Akamatsu | H01L 23/485 257/765 |
|---|---|---|---|---|
| 2007/0087551 | A1 * | 4/2007 | Gambino | H01L 23/5329 438/617 |
| 2015/0333000 | A1 * | 11/2015 | Hsu | H01L 21/76843 257/773 |
| 2019/0067290 | A1 * | 2/2019 | Wang | H01L 29/4238 |

* cited by examiner

*Primary Examiner* — John A Bodnar
(74) *Attorney, Agent, or Firm* — Schwabe, Williamson & Wyatt, P.C.

(57) ABSTRACT

Embodiments include an interconnect structure and methods of forming an interconnect structure. In an embodiment, the interconnect structure comprises a semiconductor substrate and an interlayer dielectric (ILD) over the semiconductor substrate. In an embodiment, an interconnect layer is formed over the ILD. In an embodiment, the interconnect layer comprises a first interconnect and a second interconnect. In an embodiment the interconnect structure comprises an electrically insulating plug that separates the first interconnect and the second interconnect. In an embodiment an uppermost surface of the electrically insulating plug is above an uppermost surface of the interconnect layer.

14 Claims, 10 Drawing Sheets

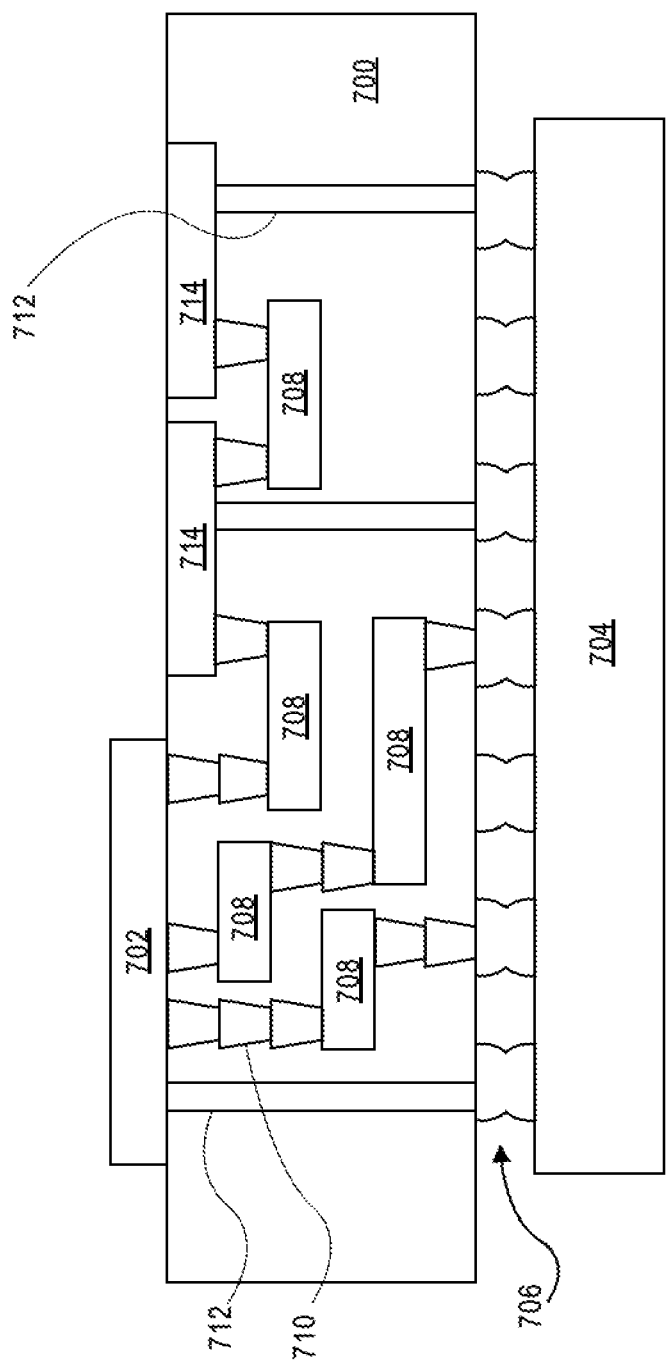

RECESSED METAL INTERCONNECTS TO MITIGATE EPE-RELATED VIA SHORTING

TECHNICAL FIELD

Embodiments of the disclosure are in the field of semiconductor structures and processing and, in particular, to recessed metal interconnects that mitigate edge placement error related shorting.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

FIG. 1A is a cross-sectional illustration of a via 112 that is contacting an underlying interconnect 107A. In FIG. 1B, a plan view illustration of the interconnects 107A and 107B separated by a plug 110 is shown. In FIG. 1B, a box with a dashed line is used to indicate the location where the via 112 is to be formed. Via 112 may be formed through an interlayer dielectric (ILD) 108. Interconnect 107A may be formed over one or more underlying ILDs 106 that include additional interconnects and vias (not shown). In an embodiment, the ILD 106 may be positioned over a semiconductor substrate 105. Interconnect 107A may be electrically isolated from interconnect 107B by an electrically non-conductive plug 110. In order to prevent an electrical short between interconnect 107A and interconnect 107B, current design rules dictate that the via 112 be offset from the end of the interconnect 107A. For example, the via 112 may be spaced away from the end of the interconnect 107A by a distance X. Depending on the layer and the overlay error, the distance X may be at least 5 nm and as much as 50 nm or more.

As illustrated, the dashed box has dimensions greater than the dimensions of the via 112 in order to account for a maximum misalignment due to overlay error of the patterning process used to form the via 112.

BRIEF DESCRIPTION OF THE DRAWINGS

FIG. 7 is an interposer implementing one or more embodiments of the disclosure.

DESCRIPTION OF THE EMBODIMENTS

Figure 1A:
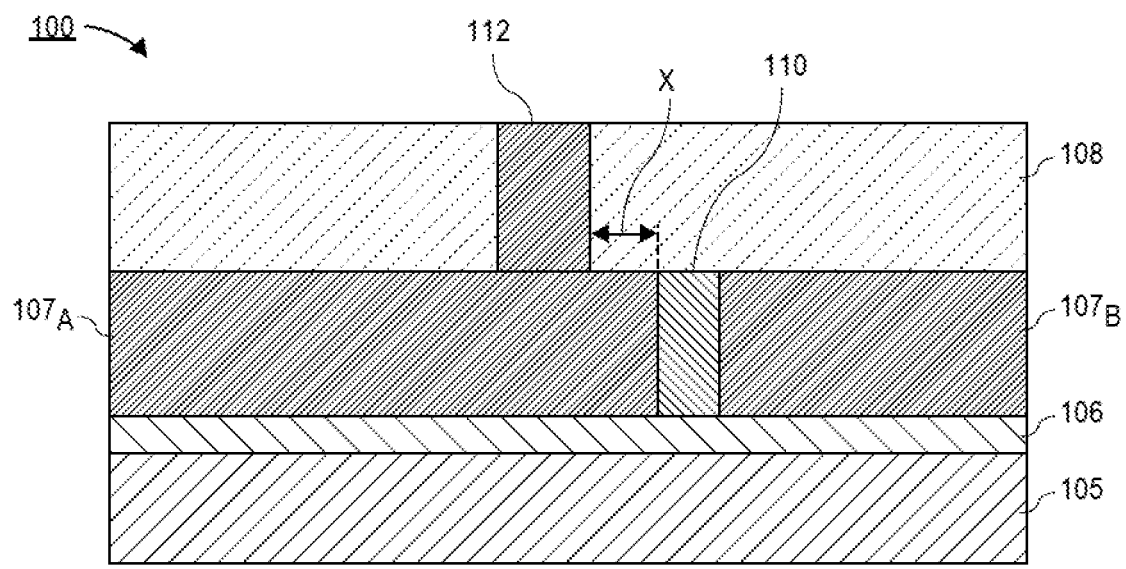
FIG. 1A is a cross-sectional illustration of an interconnect that is formed in accordance with design rules that mandate an interconnect be offset from the edge of the interconnect.
Figure 1B:
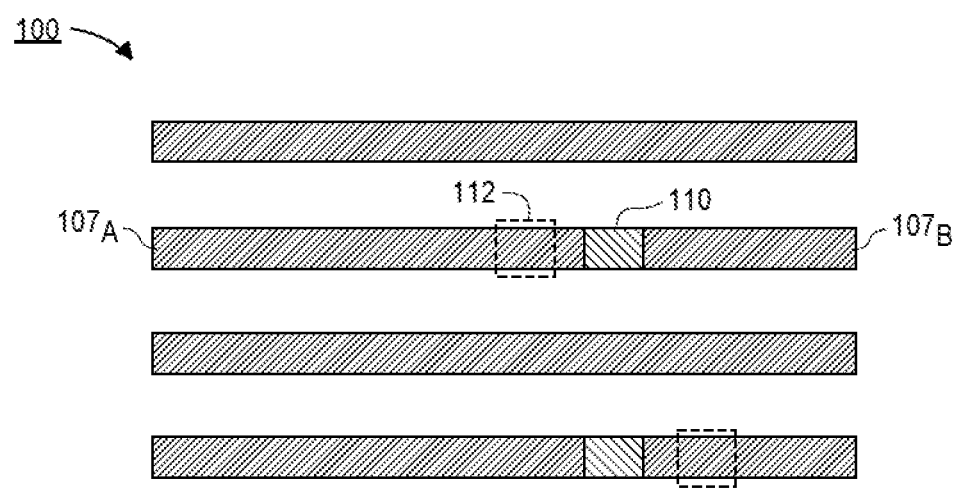
FIG. 1B is a plan view illustration of the interconnect in FIG. 1A.

Recessed metal interconnects that mitigate edge placement error (ECE) related via shorting are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 2A:
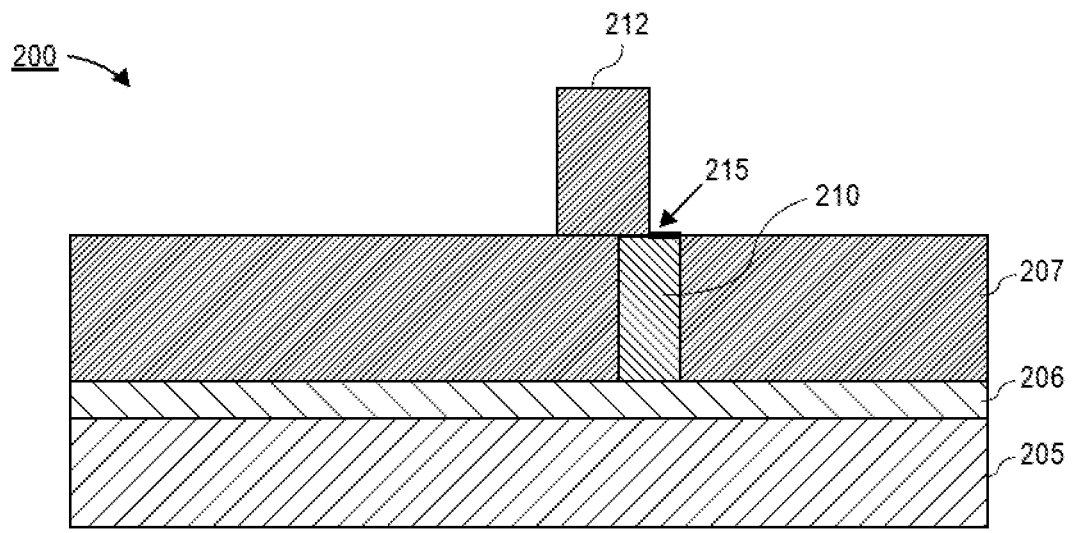
FIG. 2A is a cross-sectional illustration of an interconnect with a misaligned via.

As noted above, overlay errors increase the possibility of EPE-related via shorting when design rules are not followed. However, embodiments described herein provide interconnect and via implementations that allow for design rules relating to edge placement of vias to be less stringent and/or eliminated. For example, embodiments may include vias that are designed to be placed at the end of the interconnect. In such embodiment, the EPE may result in the via partially landing on the plug between interconnects. For example, in FIG. 2A a cross-sectional illustration of a via 212 with an EPE that results in it landing over a plug 210 is shown. This is particularly problematic because the risk of plug breakdown which leads to via shorting is increased. The plug breakdown is more likely because the effective plug thickness 215 is reduced due to the EPE.

Figure 2B:
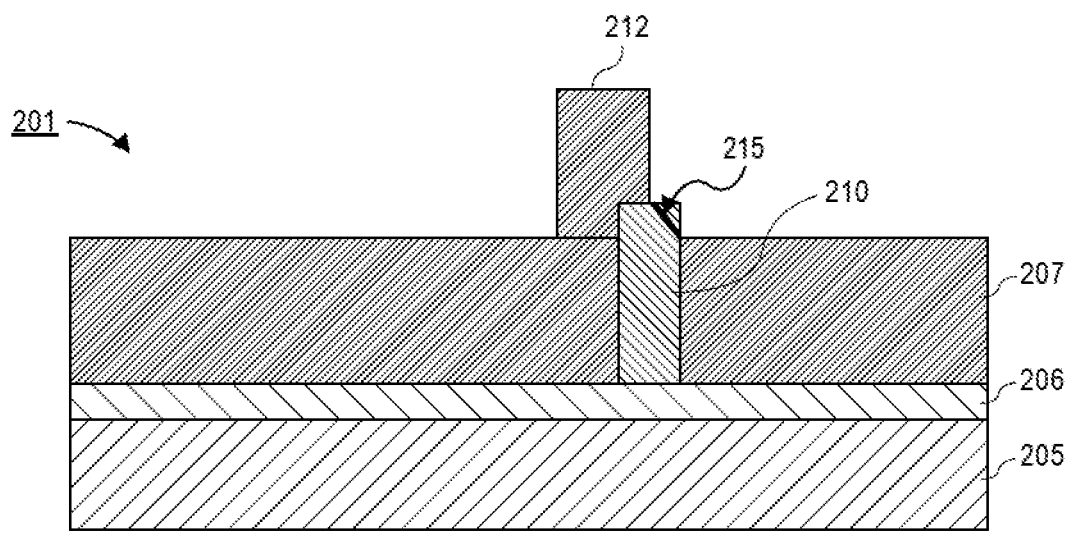
FIG. 2B is a cross-sectional illustration of a recessed interconnect with a misaligned via, in accordance with an embodiment.

Accordingly, embodiments described herein include configurations of the interconnects and the plug that lead to increased effective plug thickness 215 when EPE error occurs. Such an embodiment is illustrated in FIG. 2B. As shown, the interconnects 207A and 207B are separated by a plug 210. In an embodiment, an uppermost surface of the interconnects 207A and 207B are recessed with respect to an uppermost surface of the plug 210. Accordingly, when an edge placement error occurs, the portion of the via 212 that is over the plug 212 is raised up away from the neighboring interconnect 207B. Accordingly, the effective plug thickness 215 is increased without increasing the area dedicated to the plug 212. Additionally, since design rules regarding the placement of vias proximate to interconnect ends may be eliminated, further area savings are obtained.

Figure 3A:
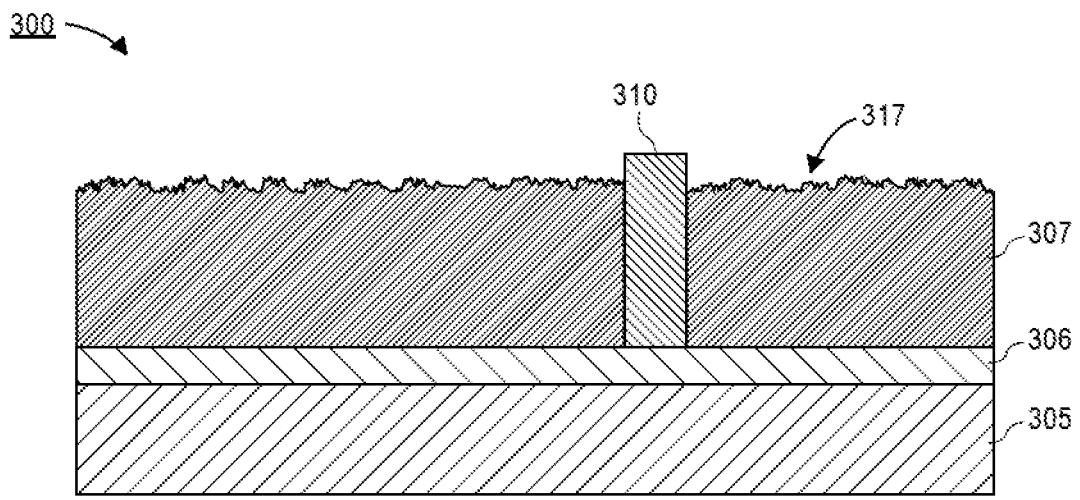
FIG. 3A is a cross-sectional illustration of a recessed interconnect with an unpolished surface, in accordance with an embodiment.

As the scale of interconnects continues to decrease, it is to be appreciated that surface roughness may also alter the effective plug thickness. For example, FIG. 3A is a cross-sectional illustration of an interconnect with a non-polished surface. Due to the variation in the surface 317 of the interconnect 307m vias with the same EPE may result in different effective plug thicknesses. Non-uniform effective plug thickness for a given edge placement error may result in devices that are susceptible to shorting and/or the devices may not function at optimal levels. In an embodiment, the rough surface may be the result of an etching process used to recess the surfaces relative to the uppermost surface of the plug 310. For example, the rough surface 317 may have a surface roughness typical of etching processes, such as approximately 3 nm/$\sigma$ or greater.

Figure 3B:
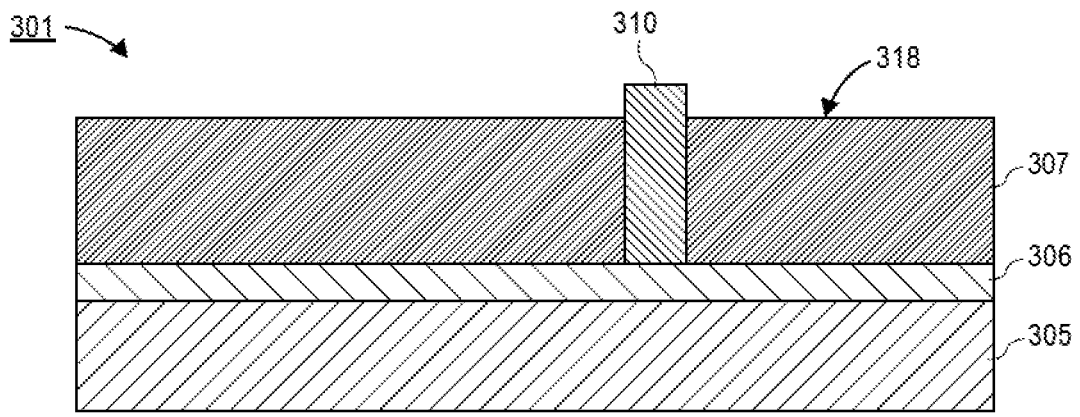
FIG. 3B is a cross-sectional illustration of a recessed interconnect with a polished surface, in accordance with an embodiment.

Accordingly, embodiments described herein include an uppermost interconnect surface that is polished. An example of such an embodiment is illustrated in FIG. 3B. In an embodiment, surface 318 is a polished surface. In an embodiment, the roughness of the uppermost interconnect surface is approximately 1.0 nm/$\sigma$ or less. In an embodiment, surface 318 may be formed with polishing process, such as a chemical mechanical polishing process. With a polished surface, the effective plug thickness 315 for a given edge placement error is maintained uniform across the substrate 305. As such, the devices may be more reliable and less susceptible to via shorting.

Figure 4A:
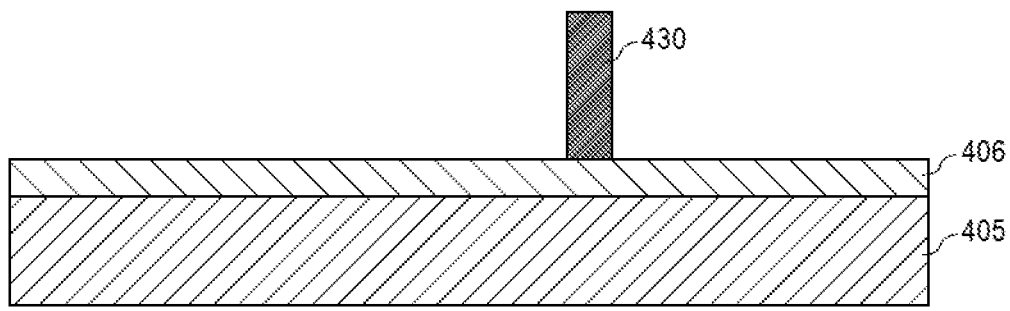
FIG. 4A is a cross-sectional illustration of a sacrificial plug formed over a substrate surface, in accordance with an embodiment.

Referring now to FIGS. 4A-4G, cross-sectional illustrations of a process for forming an interconnect device with interconnects with uppermost surfaces that are recessed below an uppermost surface of a plug between the interconnects are shown, in accordance with an embodiment. Referring now to FIG. 4A, a cross-sectional illustration of a sacrificial plug 430 formed over a substrate 405 is shown, in accordance with an embodiment. In an embodiment, the substrate 405 may be any substrate on which interconnects are formed. For example, the substrate 405 may be a semiconductor substrate. In an embodiment, one or more interlayer dielectrics (ILDs) 406 may be formed over the substrate 405. The one or more ILDs 406 may include conductive traces (i.e., interconnects) and vias for providing electrical routing to devices fabricated on the substrate 405, such as transistors and the like. While ILD 406 is shown as a single layer, it is to be appreciated the sacrificial plug 430 may be formed after any number of ILD layers have been formed, or the sacrificial plug 430 may be formed on the substrate 405.

In an embodiment, the sacrificial plug 430 may be any suitable material that is selectively etched with respect to the conductive material that will be used to form the interconnects. In an embodiment, the sacrificial plug 430 may be an oxide, a nitride, or any other suitable dielectric material. In an embodiment, the sacrificial plug may be formed with a process that comprises a blanket deposition and a lithographic patterning and etching process, as is known in the art.

Figure 4B:
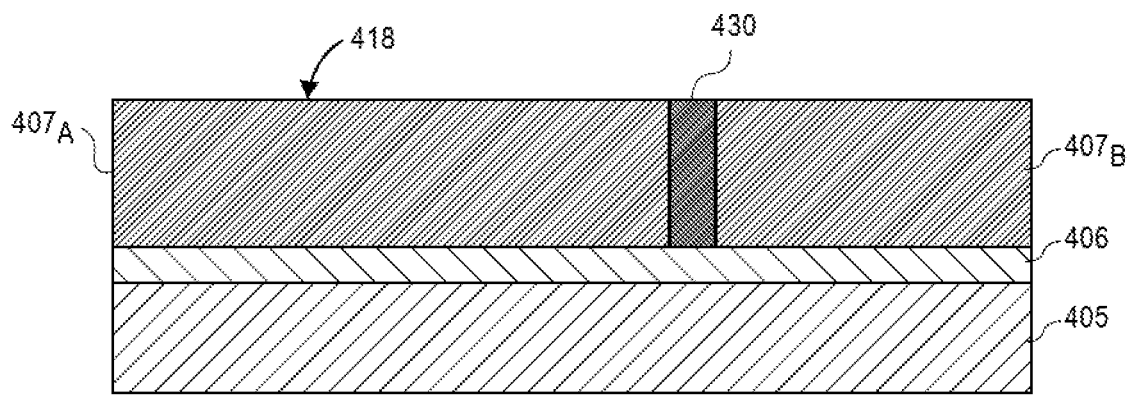
FIG. 4B is a cross-sectional illustration of an interconnect layer formed over the substrate surface and around the sacrificial plug, in accordance with an embodiment.

Referring now to FIG. 4B, a cross-sectional illustration after a conductive layer is formed over the ILD 406 and around the sacrificial plug 430 is shown, in accordance with an embodiment. In an embodiment, the conductive layer may comprise a first interconnect 407A and a second interconnect 407B. The first interconnect 407A may be separated from the second interconnect 407B by the sacrificial plug 430. In an embodiment, the first interconnect 407A and the second interconnect 407B may be conductive materials, such as metals, alloys, or the like.

In an embodiment the conductive layer used to form the first interconnect 407A and the second interconnect 407B may be deposited with any suitable deposition process, such as electroplating, chemical vapor deposition or physical vapor deposition. In an embodiment, the metal layer may deposited so that an uppermost surface is formed over an uppermost surface of the sacrificial plug 430. In an embodiment, the conductive layer may then be recessed so that the uppermost surface is substantially coplanar with an uppermost surface of the sacrificial plug 430. For example, the conductive layer may be recessed with a chemical mechanical planarization (CMP) process or the like.

The use of such a polishing process results in an uppermost surface 418 of the first interconnect 407A and the second interconnect 407B having a surface roughness that is less than the surface roughness of conductive features formed with conventional etching processes. For example, conventional etching processes typically results in a surface roughness that is 3 nm/$\sigma$ or greater. In an embodiment, the surface roughness of the uppermost surface 418 of the first interconnect 407A and the second interconnect 407B may be 1.0 nm/$\sigma$ or less. In an embodiment, the surface roughness of the uppermost surface 418 of the first interconnect 407A and the second interconnect 407B may be 0.5 nm/σ or less.

Figure 4C:
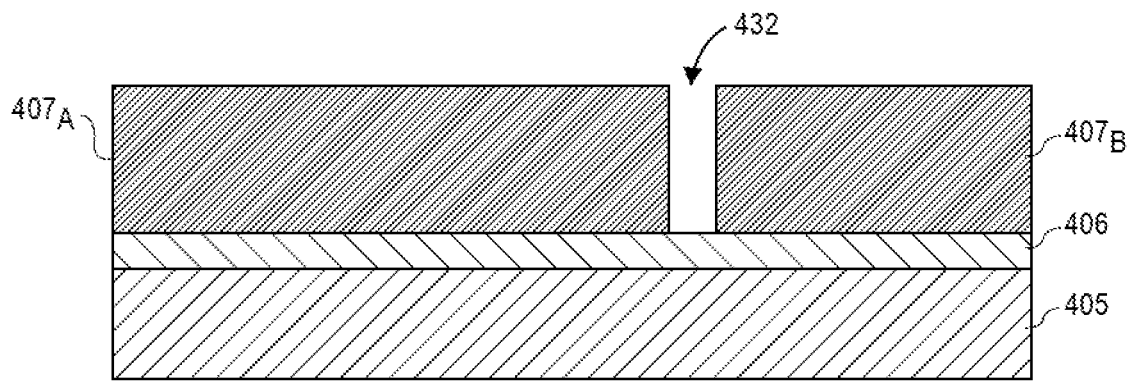
FIG. 4C is a cross-sectional illustration after the sacrificial plug is removed to form an opening in the interconnect layer, in accordance with an embodiment.

Referring now to FIG. 4C, a cross-sectional illustration after the sacrificial plug 430 is removed is shown, in accordance with an embodiment. In an embodiment, the removal of the sacrificial plug 430 results in the formation of an opening 432 between the first interconnect 407A and the second interconnect 407B. In an embodiment, the sacrificial plug 430 may be removed with an etching process that selectively removes the sacrificial plug 430 without substantially altering the interconnects 407. For example, the etching process used to remove the sacrificial plug 430 may not significantly increase a surface roughness of the uppermost surface 418 of the interconnects 407.

Figure 4D:
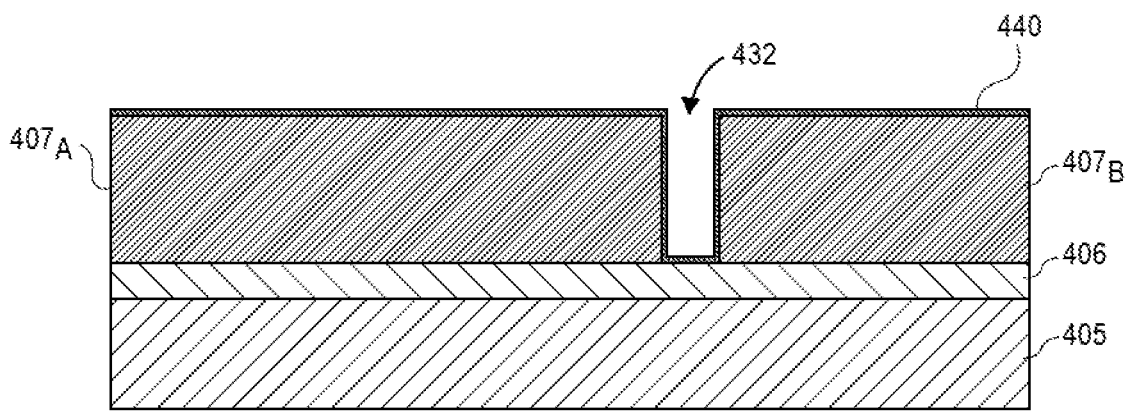
FIG. 4D is a cross-sectional illustration after an interconnect liner is formed over the interconnect layer, in accordance with an embodiment.

Referring now to FIG. 4D, a cross-sectional illustration after a liner 440 is formed over the first interconnect 407A and the second interconnect 407B is shown, in accordance with an embodiment. In an embodiment, the liner 440 may be formed with a conformal deposition process. In such embodiments, the liner 440 may be formed along sidewalls of the interconnects 407 exposed by the opening 432. In an embodiment, the liner 440 may be a non-conducting barrier layer. In an embodiment, the liner 440 may be formed with any suitable deposition process, such as chemical vapor deposition (CVD), atomic layer deposition (ALD), or the like. In some embodiments, the liner 440 may optionally be omitted.

Figure 4E:
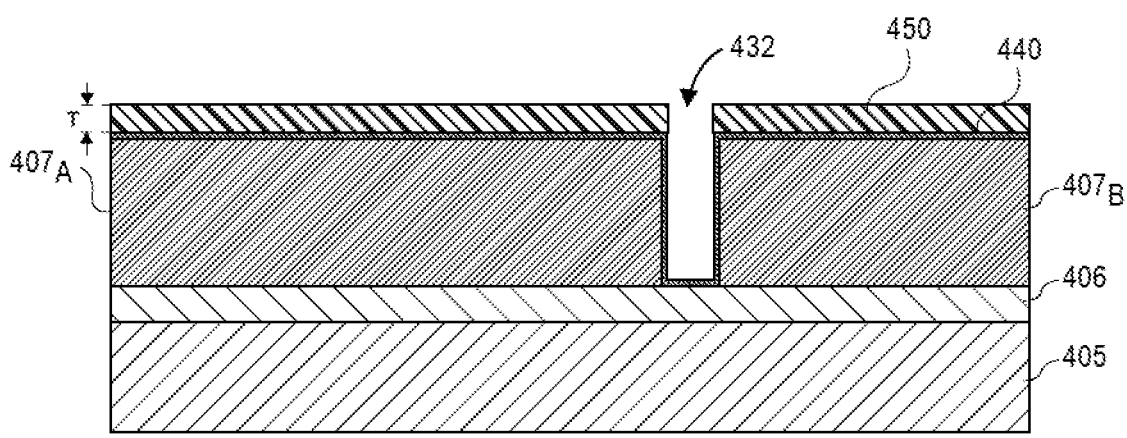
FIG. 4E is a cross-sectional illustration after a sacrificial layer is formed over the interconnect liner, in accordance with an embodiment.

Referring now to FIG. 4E, a cross-sectional illustration after a sacrificial layer 450 is formed over the uppermost surface of the interconnects 407 is shown, in accordance with an embodiment. In an embodiment, the sacrificial layer 450 may be any suitable material layer that is etch selective to a subsequently formed plug material. In an embodiment, the sacrificial layer 450 may be formed with a non-conformal process. In such an embodiment, a thickness of the sacrificial layer 450 deposited over the uppermost surface of the interconnects 407 may be greater than a thickness of the sacrificial layer 450 deposited in the opening 432, due to the aspect ratio of the opening. In such embodiments, the portion of the sacrificial layer deposited in the opening 432 may be removed with an etching process without completely removing the sacrificial layer 450 from over the uppermost surface 418 of the interconnects 407. In an embodiment, the resulting thickness T of the sacrificial layer 450 may be approximately 10 nm or greater. In an embodiment, a thickness T may be 20 nm or greater.

Figure 4F:
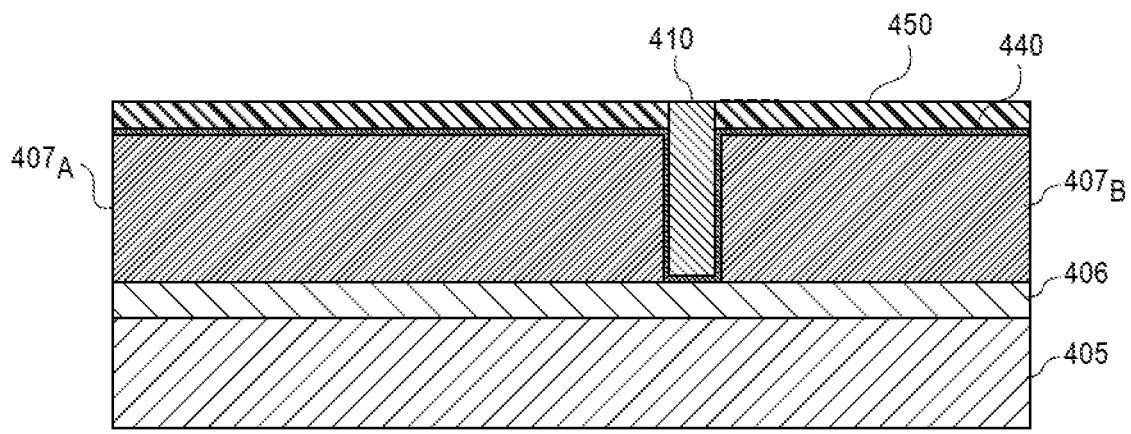
FIG. 4F is a cross-sectional illustration after a plug is formed in the opening, in accordance with an embodiment.

Referring now to FIG. 4F, a cross-sectional illustration after a plug 410 is formed between the first interconnect 407A and the second interconnect 407B is shown, in accordance with an embodiment. In an embodiment, the plug 410 may be an electrically insulating material that is etch selective to the sacrificial layer 450. In an embodiment, the plug 410 may be any suitable dielectric material, such as layer of a nitride of silicon (e.g., silicon nitride) or a layer of an oxide of silicon, or both, or a combination thereof. Other suitable materials may include carbon-based materials. In another embodiment, the plug 410 may include a metal species. For example, the plug 410 may include a layer of a nitride of titanium or another metal (e.g., titanium nitride). Potentially lesser amounts of other materials, such as oxygen, may be included in one or more of these layers. In an embodiment, the plug may be SiC, $ZrO_2$, $HfO_2$, or $Al_2O_3$.

In an embodiment, the plug 410 may be formed by CVD, PVD, or by other deposition methods. For example, the plug 410 may be deposited so that it fills the opening 432. Embodiments may include a polishing process (e.g., CMP) that results in an uppermost surface of the plug 410 being substantially coplanar with an uppermost surface of the sacrificial layer 450. In an embodiment, an uppermost surface of the plug 410 may be above an uppermost surface of the interconnects 407.

Figure 4G:
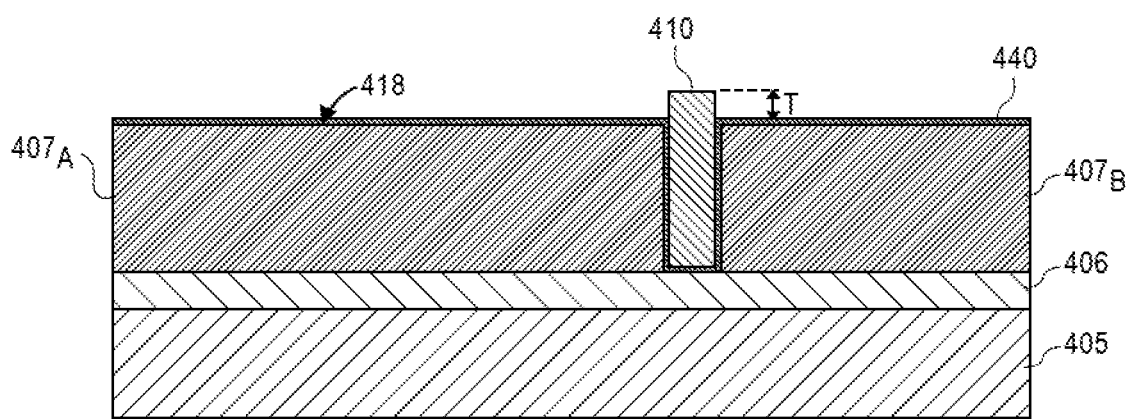
FIG. 4G is a cross-sectional illustration after the sacrificial layer is removed to reveal an interconnect that is recessed with respect to a surface of the plug, in accordance with an embodiment.

Referring now to FIG. 4G, a cross-sectional illustration after the sacrificial layer 450 is removed is shown, in accordance with an embodiment. In an embodiment, the sacrificial layer 450 may be removed with an etching process that selectively removes the sacrificial layer 450 without significantly altering the plug 410. In an embodiment, the liner 440 protects the uppermost surface 418 of the interconnects 407. In an embodiment where the liner 440 is omitted, the etching process used to remove the sacrificial layer 450 may not significantly increase a surface roughness of the uppermost surface 418 of the interconnects 407.

Removal of the sacrificial layer 450 results in the plug 450 having a protruding portion that extends above an uppermost surface 418 of the interconnects 407A and 407B. The protrusion may have a thickness T. In an embodiment, the thickness T may be substantially equal to the thickness of the sacrificial layer 450. In an embodiment, the thickness T may be approximately 10 nm or greater. In an embodiment, the thickness T may be approximately 15 nm or greater. In an embodiment, the thickness T may be approximately 20 nm or greater.

It is to be appreciated that embodiments may also include additional methods of forming a plug that has an uppermost surface that is above an uppermost surface of an interconnect with a polished surface. An example of another such process is shown in FIGS. 5A-5F.

Figure 5A:
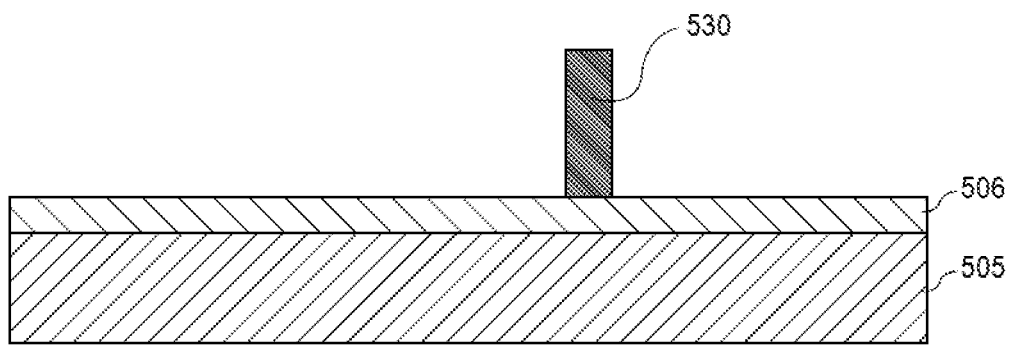
FIG. 5A is a cross-sectional illustration of a sacrificial plug formed over a substrate surface, in accordance with an embodiment.

Referring now to FIG. 5A, a cross-sectional illustration of a sacrificial plug 530 formed over a substrate 505 is shown, in accordance with an embodiment. In an embodiment, the substrate 505 may be any substrate on which interconnects are formed. For example, the substrate 505 may be a semiconductor substrate. In an embodiment, one or more interlayer dielectrics (ILDs) 506 may be formed over the substrate 505. The one or more ILDs 506 may include conductive traces (i.e., interconnects) and vias for providing electrical routing to devices fabricated on the substrate 505, such as transistors and the like. While ILD 506 is shown as a single layer, it is to be appreciated the sacrificial plug 530 may be formed after any number of ILD layers have been formed, or the sacrificial plug 530 may be formed on the substrate 505.

In an embodiment, the sacrificial plug 530 may be any suitable material that is selectively etched with respect to the conductive material that will be used to form the interconnects. In an embodiment, the sacrificial plug 530 may be an oxide, a nitride, or any other suitable dielectric material. In an embodiment, the sacrificial plug may be formed with a process that comprises a blanket deposition and a lithographic patterning and etching process, as is known in the art.

Figure 5B:
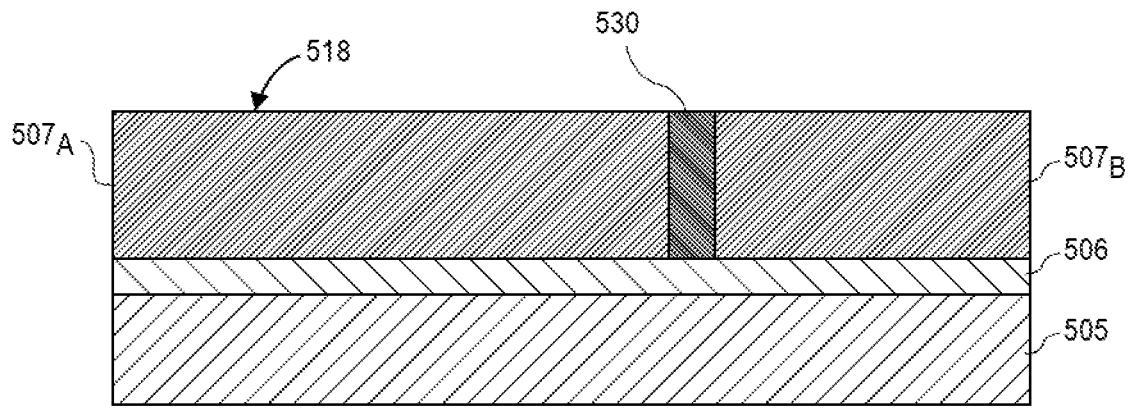
FIG. 5B is a cross-sectional illustration of an interconnect layer formed over the substrate surface and around the sacrificial plug, in accordance with an embodiment.

Referring now to FIG. 5B, a cross-sectional illustration after a conductive layer is formed over the ILD 506 and around the sacrificial plug 530 is shown, in accordance with an embodiment. In an embodiment, the conductive layer may comprise a first interconnect 507A and a second interconnect 507B. The first interconnect 507A may be separated from the second interconnect 507B by the sacrificial plug 530. In an embodiment, the first interconnect 507A and the second interconnect 507B may be conductive materials, such as metals, alloys, or the like.

In an embodiment the conductive layer used to form the first interconnect 507A and the second interconnect 507B may be deposited with any suitable deposition process, such as electroplating, chemical vapor deposition or physical vapor deposition. In an embodiment, the metal layer may deposited so that an uppermost surface is formed over an uppermost surface of the sacrificial plug 530. In an embodiment, the conductive layer may then be recessed so that the uppermost surface is substantially coplanar with an uppermost surface of the sacrificial plug 530. For example, the conductive layer may be recessed with a chemical mechanical planarization (CMP) process or the like.

The use of such a polishing process results in an uppermost surface 518 of the first interconnect 507A and the second interconnect 507B having a surface roughness that is less than the surface roughness of conductive features formed with conventional etching processes. For example, conventional etching processes typically results in a surface roughness that is 3 nm/σ or greater. In an embodiment, the surface roughness of the uppermost surface 518 of the first interconnect 507A and the second interconnect 507B may be 1.0 nm/σ or less. In an embodiment, the surface roughness of the uppermost surface 518 of the first interconnect 507A and the second interconnect 507B may be 0.5 nm/σ or less.

Figure 5C:
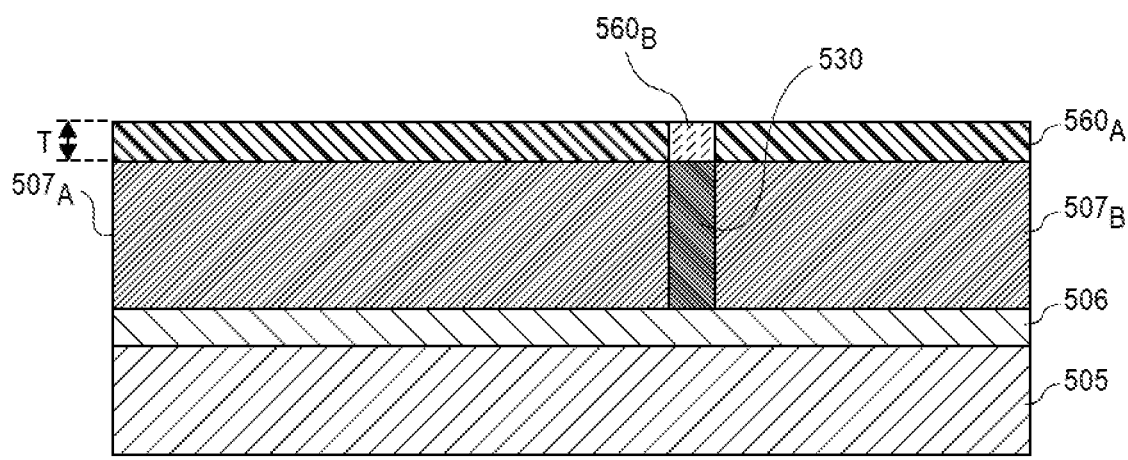
FIG. 5C is a cross-sectional illustration after sacrificial layers are selectively formed over the surfaces of the sacrificial plug and the interconnect layer, in accordance with an embodiment.

Referring now to FIG. 5C, a cross-sectional illustration after a sacrificial layer over the interconnects 507 is shown, in accordance with an embodiment. In an embodiment, the sacrificial layer 560 may comprise a first portion 560A and a second portion 560B. In a particular embodiment, the sacrificial layer 560 may comprise a diblock copolymer. In such an embodiment, the diblock copolymer may selectively segregate so that a first portion 560A is formed over the interconnects 507 and a second portion 560B is formed over the sacrificial plug 530. In an embodiment, the second portion 560B may be etch selective to the first portion 560A. In embodiments, the sacrificial layer 560 may be formed with other processes that yield a first portion and a second portion other than diblock copolymers. For example, a first portion 560A may be selectively deposited or grown on the interconnect 507 and a second portion 560B may be selectively deposited or grown on the sacrificial plug 530. In an embodiment, the resulting thickness T of the sacrificial layer 560 may be approximately 10 nm or greater. In an embodiment, a thickness T may be 20 nm or greater.

Figure 5D:
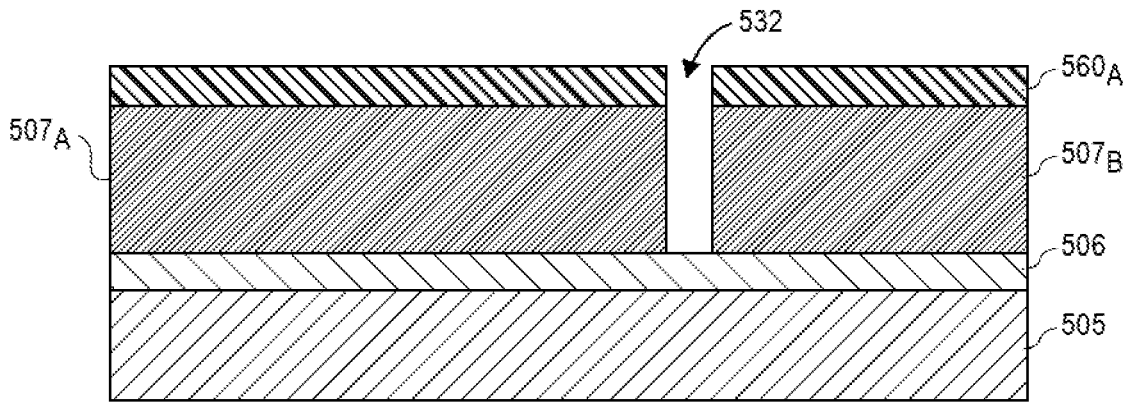
FIG. 5D is a cross-sectional illustration after the sacrificial layer over the sacrificial plug and the sacrificial plug are removed, in accordance with an embodiment.

Referring now to FIG. 5D a cross-sectional illustration after the sacrificial plug 530 and the second portion 560B of the sacrificial layer are removed is shown, in accordance with an embodiment. In an embodiment, the removal of the sacrificial plug 530 and the second portion 560B of the sacrificial layer results in the formation of an opening 532 between the first interconnect 507A and the second interconnect 507B. In an embodiment, the sacrificial plug 530 may be removed with one or more etching processes that selectively removes the sacrificial plug 530 and the second portion 560B of the sacrificial layer without substantially altering the first portion 560A of the sacrificial layer.

Figure 5E:
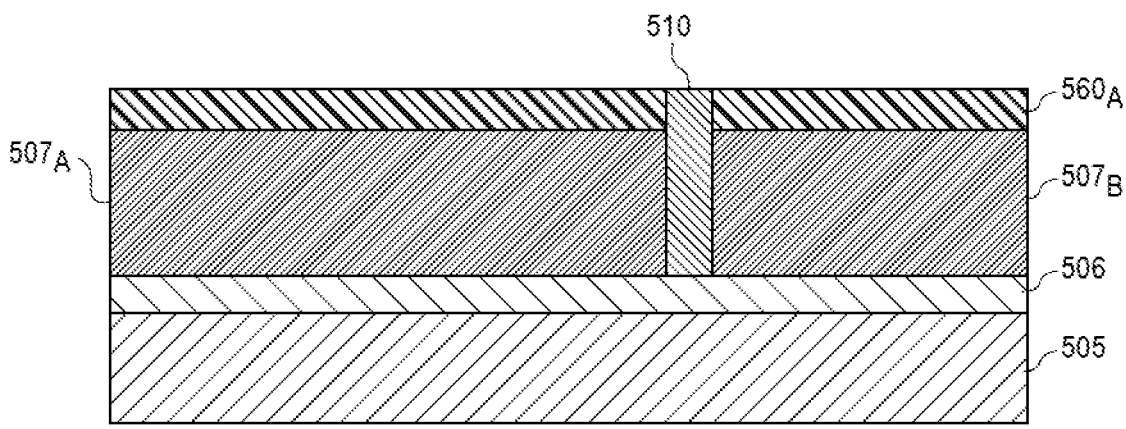
FIG. 5E is a cross-sectional illustration after a plug is formed in the opening, in accordance with an embodiment.

Referring now to FIG. 5E, a cross-sectional illustration after a plug 510 is formed between the first interconnect 507A and the second interconnect 507B is shown, in accordance with an embodiment. In an embodiment, the plug 510 may be an electrically insulating material that is etch selective to the sacrificial layer 560A. In an embodiment, the plug 510 may be any suitable dielectric material, such as layer of a nitride of silicon (e.g., silicon nitride) or a layer of an oxide of silicon, or both, or a combination thereof. Other suitable materials may include carbon-based materials. In another embodiment, the plug 510 may include a metal species. For example, the plug 510 may include a layer of a nitride of titanium or another metal (e.g., titanium nitride). Potentially lesser amounts of other materials, such as oxygen, may be included in one or more of these layers.

In an embodiment, the plug 510 maybe formed by CVD, PVD, or by other deposition methods. For example, the plug 510 may be deposited so that it fills the opening 532. Embodiments may include a polishing process (e.g., CMP) that results in an uppermost surface of the plug 510 being substantially coplanar with an uppermost surface of the sacrificial layer 560A. In an embodiment, an uppermost surface of the plug 510 may be above an uppermost surface of the interconnects 507.

Figure 5F:
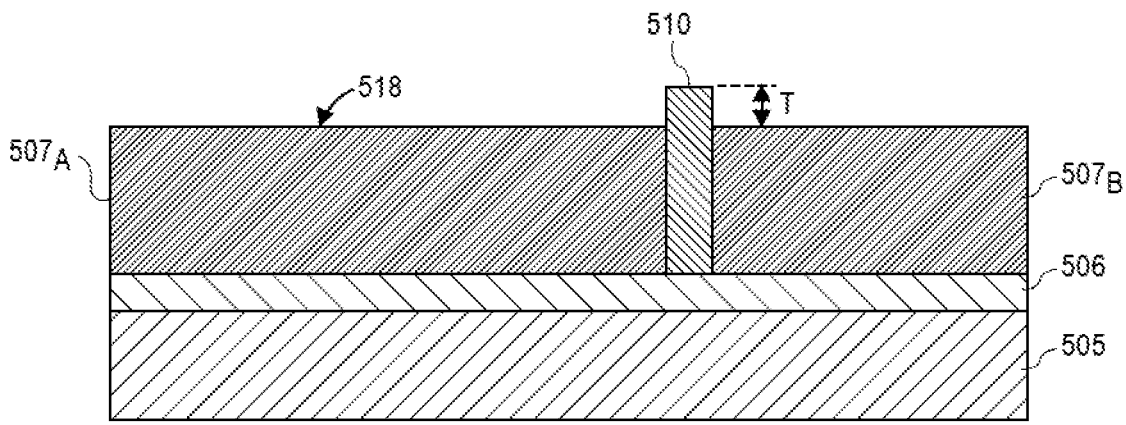
FIG. 5F is a cross-sectional illustration after the sacrificial layer over the interconnect layer is removed expose an interconnect layer surface that is recessed with respect to a surface of the plug, in accordance with an embodiment.

Referring now to FIG. 5F, a cross-sectional illustration after the first portion 560A of the sacrificial layer is removed is shown, in accordance with an embodiment. In an embodiment, the first portion 560A of the sacrificial layer may be removed with an etching process that selectively removes the first portion 560A of the sacrificial layer without significantly altering the plug 510. In an embodiment, the etching process used to remove the first portion 560A of the sacrificial layer may not significantly increase a surface roughness of the uppermost surface 518 of the interconnects 507.

Removal of the first portion 560A of the sacrificial layer results in the plug 510 having a protruding portion that extends above an uppermost surface 518 of the interconnects 507A and 507B. The protrusion may have a thickness T. In an embodiment, the thickness T may be substantially equal to the thickness of the first portion 560A of the sacrificial layer. In an embodiment, the thickness T may be approximately 10 nm or greater. In an embodiment, the thickness T may be approximately 15 nm or greater. In an embodiment, the thickness T may be approximately 20 nm or greater.

It is to be appreciated that the layers and materials described above may be formed in, on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level back end of line (BEOL) interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, sacrificial layers are composed of dielectric materials different from the interlayer dielectric material. In one embodiment, different sacrificial materials may be used in different regions so as to provide different growth or etch selectivity to each other and to the underlying dielectric and metal layers. In some embodiments, a sacrificial layer includes a layer of a nitride of silicon (e.g., silicon nitride) or a layer of an oxide of silicon, or both, or a combination thereof. Other suitable materials may include carbon-based materials. In another embodiment, a sacrificial material includes a metal species. For example, a sacrificial material or other overlying material may include a layer of a nitride of titanium or another metal (e.g., titanium nitride). Potentially lesser amounts of other materials, such as oxygen, may be included in one or more of these layers. Alternatively, other sacrificial layers known in the arts may be used depending upon the particular implementation. The sacrificial layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion lithography (i193), extreme ultra-violet (EUV) and/or electron-beam direct write (EBDW) lithography, directed self-assembly, etc. In other embodiments, the pitch does not need to be constant, nor does the width.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a constant pitch and having a constant width. The pattern may be fabricated by a pitch halving or pitch quartering, or other pitch division, approach.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
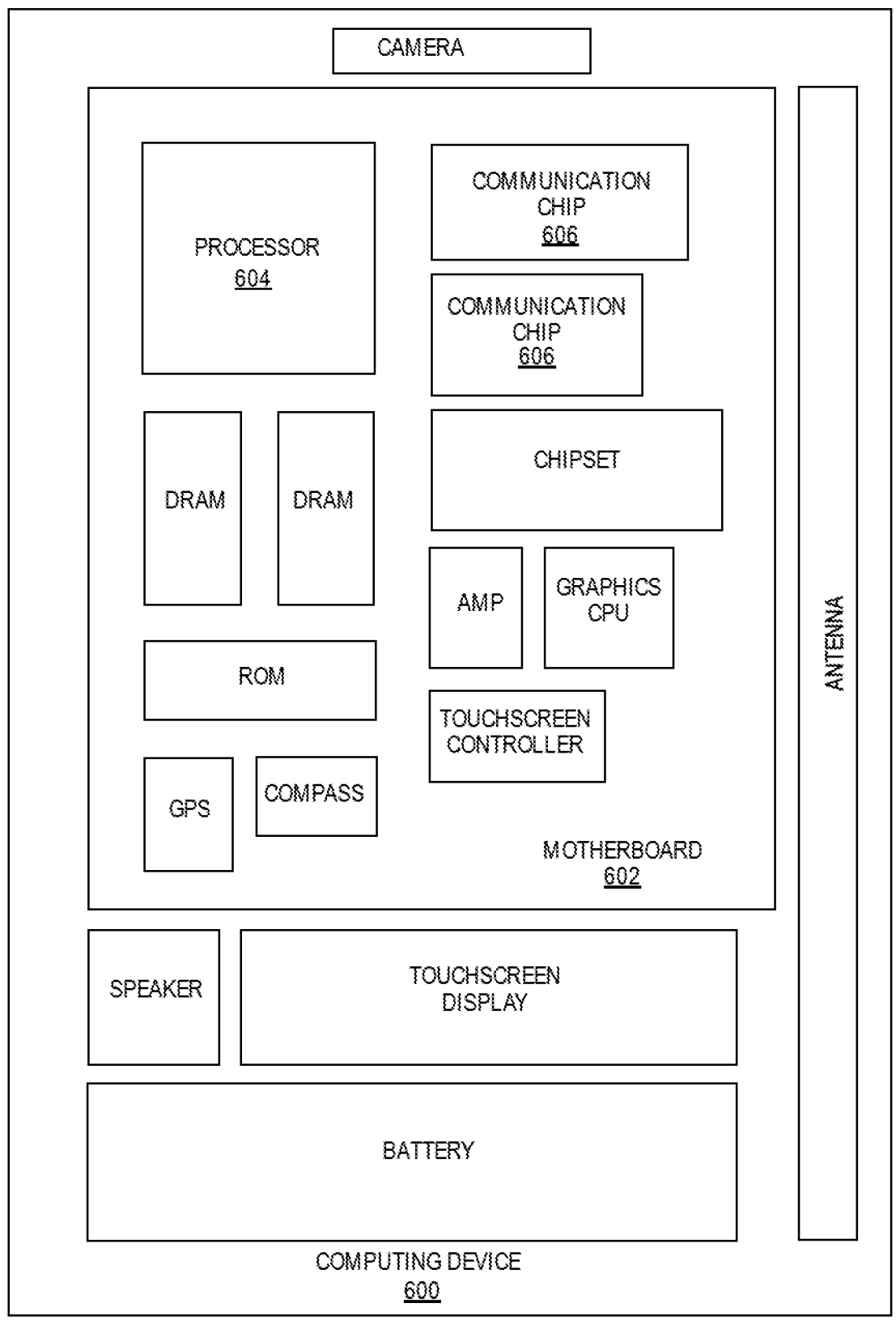
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor includes or is fabricated using an adamantane-based carbon hardmask material as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip includes or is fabricated using an adamantane-based carbon hardmask material as described herein.

In further implementations, another component housed within the computing device 600 may contain an integrated circuit die that includes recessed interconnect lines separated by a plug where an uppermost surface of the interconnect lines is below an uppermost surface of the plug, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure include carbon-based dielectric materials for semiconductor structure fabrication, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: An interconnect structure, comprising: a semiconductor substrate; an interlayer dielectric (ILD) over the semiconductor substrate; an interconnect layer over the ILD, wherein the interconnect layer comprises a first interconnect and a second interconnect; and an electrically insulating plug that separates the first interconnect and the second interconnect, wherein an uppermost surface of the electrically insulating plug is above an uppermost surface of the interconnect layer.

Example 2: the interconnect structure of Example 1, wherein the uppermost surface of the interconnect layer is has a roughness that is less than a roughness of an etched metal surface.

Example 3: the interconnect structure of Example 1 or Example 2, wherein the roughness of the uppermost surface of the interconnect layer is 0.5 nm/$\sigma$ or less.

Example 4: the interconnect structure of Examples 1-3, wherein the uppermost surface of the electrically insulating plug is at least 10 nm above the uppermost surface of the interconnect layer.

Example 5: the interconnect structure of Examples 1-4, wherein the uppermost surface of the electrically insulating plug is between 15 nm and 20 nm above the uppermost surface of the interconnect layer.

Example 6: the interconnect structure of Examples 1-5, further comprising: a liner over the interconnect layer, wherein the liner separates the electrically insulating plug from the first interconnect and the second interconnect.

Example 7: the interconnect structure of Examples 1-6, wherein the electrically insulating plug is selective to $SiO_x$ and SiN etches.

Example 8: the interconnect structure of Examples 1-7, wherein the electrically insulating plug comprises SiC.

Example 9: the interconnect structure of Examples 1-8, wherein the electrically insulating plug comprises a metal oxide.

Example 10: the interconnect structure of Examples 1-9, wherein the electrically insulating plug comprises $ZrO_2$, $HfO_2$, or $Al_2O_3$.

Example 11: a method of forming an interconnect structure, comprising: forming a sacrificial plug on a surface of a substrate; forming an interconnect layer over the surface of the substrate, wherein the interconnect layer surrounds sidewalls of the sacrificial plug; removing the sacrificial plug to form an opening in the interconnect layer; forming a sacrificial layer over an uppermost surface of the interconnect layer; forming an electrically insulating plug in the opening, wherein an uppermost surface of the electrically insulating plug is above the uppermost surface of the interconnect layer; and removing the sacrificial layer.

Example 12: the method of Example 11, wherein forming the interconnect layer over the surface of the substrate comprises: depositing a blanket layer of the metal; and polishing the interconnect layer so that the uppermost surface of the interconnect layer is substantially coplanar with an uppermost surface of the sacrificial plug.

Example 13: the method of Example 12 or Example 11, wherein the uppermost surface of the interconnect layer is has a roughness that is less than a roughness of an etched metal surface.

Example 14: the method of Examples 11-13, wherein the roughness of the uppermost surface of the interconnect layer is 0.5 nm/σ or less.

Example 15: the method of Examples 11-14, wherein forming the sacrificial layer over the uppermost surface of the interconnect layer comprises: depositing the sacrificial layer with a non-conformal deposition process, wherein a thickness of the sacrificial layer on the uppermost surface of the interconnect layer is greater than a thickness of the sacrificial layer in the opening in the interconnect layer; and etching the sacrificial layer to remove portions of the sacrificial layer deposited in the opening in the interconnect layer.

Example 16: a method of forming an interconnect structure, comprising: forming a sacrificial plug on a surface of a substrate; forming an interconnect layer over the surface of the substrate, wherein the interconnect layer surrounds sidewalls of the sacrificial plug; forming a sacrificial layer over the interconnect layer, wherein the sacrificial layer is selectively formed over the interconnect layer and not over the sacrificial plug; removing the sacrificial plug to form an opening in the interconnect layer; forming an electrically insulating plug in the opening, wherein an uppermost surface of the electrically insulating plug is above the uppermost surface of the interconnect layer; and removing the sacrificial layer.

Example 17: the method of Example 16, wherein the uppermost surface of the electrically insulating plug is at least 10 nm above the uppermost surface of the interconnect layer.

Example 18: the method of Example 16 or Example 17, wherein the sacrificial layer is a first constituent of a diblock copolymer, and wherein a second constituent of the diblock copolymer is selectively formed over the sacrificial plug and not over the interconnect layer.

Example 19: the method of Examples 16-18, wherein forming the interconnect layer over the surface of the substrate comprises: depositing a blanket layer of the metal; and polishing the interconnect layer so that the uppermost surface of the interconnect layer is substantially coplanar with an uppermost surface of the sacrificial plug.

Example 20: the method of Examples 16-19, wherein the uppermost surface of the interconnect layer has a roughness that is less than a roughness of an etched metal surface.

Example 21: the method of Examples 16-20, wherein the roughness of the uppermost surface of the interconnect layer is 0.5 nm/σ or less.

Example 22: a semiconductor device, comprising: a transistor device formed on a semiconductor substrate; a plurality of interlayer dielectrics (ILDs) disposed over the semiconductor substrate; a plurality of interconnect layers in the plurality of ILDs, wherein at least one of the interconnect layers is electrically coupled to the transistor device; and a plurality of electrically isolating plugs, wherein each electrically isolating plug intersects an interconnect layer, and wherein an uppermost surface of each electrically isolating plug is above an uppermost surface of the interconnect layer the electrically isolating plug is intersecting.

Example 23: the semiconductor device of Example 22, wherein the uppermost surface of the interconnect layer is has a roughness that is 0.5 nm/σ or less.

Example 24: the semiconductor device of Example 22 or Example 23, wherein the uppermost surface of the electrically insulating plug is at least 10 nm above the uppermost surface of the interconnect layer.

Example 25: the semiconductor device of Examples 22-24, further comprising: a liner over the interconnect layer, wherein the liner separates the electrically insulating plug from the interconnect layer.

What is claimed is:
1. An interconnect structure, comprising:
    a semiconductor substrate;
    an interlayer dielectric (ILD) over the semiconductor substrate;
    an interconnect layer over the ILD, wherein the interconnect layer comprises a first interconnect and a second interconnect; and
    an electrically insulating plug that separates the first interconnect and the second interconnect, wherein an uppermost surface of the electrically insulating plug is above an uppermost surface of the interconnect layer, and wherein the electrically insulating plug is not vertically overlapping with the interconnect layer.

2. The interconnect structure of claim 1, wherein the uppermost surface of the interconnect layer is has a roughness that is less than a roughness of an etched metal surface of the interconnect layer.

3. The interconnect structure of claim 2, wherein the roughness of the uppermost surface of the interconnect layer is 0.5 nm/σ or less.

4. The interconnect structure of claim 1, wherein the uppermost surface of the electrically insulating plug is at least 10 nm above the uppermost surface of the interconnect layer.

5. The interconnect structure of claim 4, wherein the uppermost surface of the electrically insulating plug is between 15 nm and 20 nm above the uppermost surface of the interconnect layer.

6. The interconnect structure of claim 1, further comprising:
a liner over the interconnect layer, wherein the liner separates the electrically insulating plug from the first interconnect and the second interconnect.

7. The interconnect structure of claim 1, wherein the electrically insulating plug is selective to $SiO_x$ and SiN etches.

8. The interconnect structure of claim 7, wherein the electrically insulating plug comprises SiC.

9. The interconnect structure of claim 7, wherein the electrically insulating plug comprises a metal oxide.

10. The interconnect structure of claim 9, wherein the electrically insulating plug comprises $ZrO_2$, $HfO_2$, or $Al_2O_3$.

11. A semiconductor device, comprising:
a transistor device formed on a semiconductor substrate;
a plurality of interlayer dielectrics (ILDs) disposed over the semiconductor substrate;
a plurality of interconnect layers in the plurality of ILDs, wherein at least one of the interconnect layers is electrically coupled to the transistor device; and
a plurality of electrically isolating plugs, wherein each electrically isolating plug intersects an interconnect layer, and wherein an uppermost surface of each electrically isolating plug is above an uppermost surface of the interconnect layer the electrically isolating plug is intersecting, and wherein each electrically insulating plug is not vertically overlapping with the interconnect layer.

12. The semiconductor device of claim 11, wherein the uppermost surface of the interconnect layer is has a roughness that is 0.5 nm/σ or less.

13. The semiconductor device of claim 11, wherein the uppermost surface of the electrically insulating plug is at least 10 nm above the uppermost surface of the interconnect layer.

14. The semiconductor device of claim 11, further comprising:
a liner over the interconnect layer, wherein the liner separates the electrically insulating plug from the interconnect layer.

* * * * *